United States Patent
Yamamoto

[11] Patent Number: 6,146,972
[45] Date of Patent: Nov. 14, 2000

[54] METHOD FOR FABRICATING SEMICONDUCTOR DEVICE

[75] Inventor: Ichiro Yamamoto, Tokyo, Japan

[73] Assignee: NEC Corporation, Japan

[21] Appl. No.: 09/095,681

[22] Filed: Jun. 10, 1998

[30] Foreign Application Priority Data

Jun. 11, 1997 [JP] Japan ................................ 9-153786

[51] Int. Cl.[7] ................................................. H01L 21/76
[52] U.S. Cl. .................... 438/425; 438/423; 438/424; 438/433; 438/439; 438/449; 438/585; 438/587
[58] Field of Search .................................. 438/403, 404, 438/424, 423, 425, 433, 439, 449, 766, 783, 517, 524, 585, 587

[56] References Cited

U.S. PATENT DOCUMENTS

| | | | |
|---|---|---|---|
| 4,412,375 | 11/1983 | Matthews | 29/571 |
| 4,755,477 | 7/1988 | Chao | 438/448 |
| 4,968,636 | 11/1990 | Sugawara | 438/766 |
| 5,091,332 | 2/1992 | Bohr et al. | 438/450 |
| 5,306,940 | 4/1994 | Yamazaki | 257/374 |
| 5,413,953 | 5/1995 | Chien et al. | 438/443 |
| 5,434,099 | 7/1995 | Hsue | 438/451 |
| 5,614,434 | 3/1997 | Chao | 437/70 |

FOREIGN PATENT DOCUMENTS

| | | | |
|---|---|---|---|
| 36935 | 6/1978 | Japan | H01L 21/318 |
| 55-56635 | 4/1980 | Japan | H01L 21/318 |
| 5536935 | 3/1999 | Japan | H01L 21/318 |
| 9736323 | 10/1997 | WIPO | H01L 21/762 |

OTHER PUBLICATIONS

Stress in ion-implanted CVD $Si_3N_4$ films Author—E.P. EerNisse.
Published—Sendia Laboratories, Albequerque, NM Apr. 15, 1997.
Journal of Applied Physics, vol. 48, No. 8 (1977) by E.P. EerNisse pp. 3337–3341.

Primary Examiner—John F. Niebling
Assistant Examiner—Lynne Gurley
Attorney, Agent, or Firm—Hayes, Soloway, Hennessey, Grossman & Hage, P.C.

[57] ABSTRACT

Ions are implanted into a silicon nitride film at a dose of not more than $1 \times 10^{15}$ cm$^{-2}$ so that the projected range of the ions is 20 to 60% of the thickness of the silicon nitride film. This enables the stress of the nitride film to be reduced while enjoying good productivity without introduction of defects into a silicon substrate.

22 Claims, 8 Drawing Sheets

DEPENDENCY OF RESIDUAL STRESS OF $Si_3N_4$ FILM UPON DOSE OF As IMPLANTATION

DEPENDENCY OF RESIDUAL STRESS OF $Si_3N_4$ FILM UPON As IMPLANTATION ENERGY

DEPENDENCY OF RESIDUAL STRESS OF $Si_3N_4$ FILM UPON DOSE OF P IMPLANTATION

DEPENDENCY OF RESIDUAL STRESS OF $Si_3N_4$ FILM UPON P IMPLANTATION ENERGY

DEPENDENCY OF RESIDUAL STRESS OF $Si_3N_4$ FILM UPON As IMPLANTATION ENERGY

RESIDUAL STRESS OF $Si_3N_4$ FILM AND IMPLANTATION CONDITIONS

METHOD FOR FABRICATING SEMICONDUCTOR DEVICE

FIELD OF THE INVENTION

The present invention relates to a method for fabricating a semiconductor device, and more particularly to a method for fabricating a semiconductor device comprising a silicon nitride film for an isolation mask provided on a semiconductor substrate.

BACKGROUND OF THE INVENTION

In a conventional method for fabricating a semiconductor device, an about 10 nm-thick pad oxide film is formed on a silicon substrate, and an about 200 nm-thick silicon nitride film is then formed by CVD (chemical vapor deposition). The whole surface of the silicon nitride film is coated with a photoresist, and the photoresist is patterned in accordance with a field pattern by photolithography. Next, the silicon nitride film is selectively etched using the photoresist as the mask, and the photoresist is removed, followed by thermal oxidation in a water vapor atmosphere to form a field oxide film. The silicon nitride film and the pad oxide film are then removed, a gate oxide film is formed, gate polysilicon is grown on the whole surface of the gate oxide film and the field oxide film, and the gate polysilicon is doped with an impurity by ion implantation or diffusion. A photoresist is coated on the whole surface of the gate polysilicon, and the photoresist is patterned in accordance with a gate pattern by photolithography. In the patterning of the photoresist, registration with the underlying field pattern is carried out. Next, the gate polysilicon is selectively etched using the photoresist as a mask, and the resist is removed to form gate electrodes. The gate electrode may be a single polysilicon layer as adopted in this method, or alternatively may have a polycide structure wherein a silicide is stacked on polysilicon. Further, subsequent ion implantation into source/drain may serve also as the doping of the gate polysilicon.

In the conventional method for fabricating a semiconductor device, however, misregistration is created in registration for the later step with respect to the underlying field pattern, for example, registration between the gate pattern and the field pattern. This is because the silicon nitride film has strong tensile stress and causes shrinkage of wafer. Specifically, the resist patterning for the field is carried out on a silicon substrate shrunken by tensile stress. When the silicon nitride film is removed after the formation of the field oxide film, the silicon substrate is in a stretched state as compared with the time when the resist patterning of the field has been performed. Therefore, the field pattern is larger than the original size. Since the underlying field pattern is larger than the original size, misregistration attributable to a difference in dimension between the field and the gate is created at the time of forming a resist pattern for the gate in a later step. The larger the size of the chip and consequently the smaller the minimum fabrication dimension, the larger the influence of misregistration at the time of registration/exposure attributable to the shrinkage of the wafer created by the stress. In order to alleviate this problem, Eer Nisse et al., Journal of Applied Physics, vol. 48, No. 8 (1977), pp. 3337–3341 discloses that the stress of the nitride film can be reduced by ion implantation in the vicinity of the interface of the nitride film and the substrate silicon under such conditions that the projected range is rendered identical. The ion implantation in this way however, causes about half of the injected ions to penetrate into the silicon substrate. These ions which have penetrated into the silicon substrate create defects in the silicon substrate. The defects lead to problems, for example, leak current and deteriorated proof voltage in a completed device.

Japanese Patent Laid-Open No. 36935/1980 discloses that ion implantation into a silicon nitride film at a high dose of $1 \times 10^{15}$ to $1 \times 10^{17}$ cm$^{-2}$ results in lowered stress. Long ion implantation time is necessary for the ion implantation at such a high dose, leading to lowered productivity, which is unsuitable for practical use. Further, although ion implantation into the silicon nitride film is described, this publication is silent on conditions under which the ions should be implanted into the film. Therefore, here again the above problems are likely to occur.

The present inventor has made detailed studies on the relationship between the conditions for the ion implantation and the stress of the silicon nitride film and as a result has found that careful selection of the ion implantation energy can effectively reduce the stress of the silicon nitride film, unlike the prior art technique, without penetration of injected ions into the silicon substrate to deteriorate the device properties and without lowering productivity.

SUMMARY OF THE INVENTION

Accordingly, it is an object of the invention is to provide a method for fabricating a semiconductor device that, by ion implantation into a silicon nitride film under suitable conditions, can effectively reduce the stress of the silicon nitride film while enjoying good productivity without introducing any defect into a silicon substrate.

According to the first feature of the invention, a method for fabricating a semiconductor device, comprises the steps of:

forming a pad oxide film and a silicon nitride film successively on a semiconductor substrate;

implanting ions into said silicon nitride film;

selectively removing said silicon nitride film in accordance with a field pattern;

growing silicon oxide films at positions where said silicon nitride film is removed;

removing said pad oxide film and said silicon nitride film which is left at the step of selectively removing said silicon nitride film; and forming a semiconductor device between said silicon oxide films.

According to the second feature of the invention, a method for fabricating a semiconductor device, comprises the steps of:

forming a pad oxide film and a silicon nitride film successively on a semiconductor substrate;

implanting ions into said silicon nitride film;

selectively removing said silicon nitride film in accordance with a field pattern;

forming grooves into said semiconductor substrate at positions where said silicon nitride film is removed;

filling said grooves and removed portions of said silicon nitride film with silicon oxide films;

removing said silicon nitride film which is left at the step of selectively removing said silicon nitride film; and forming a semiconductor device between said silicon oxide films.

BRIEF DESCRIPTION OF THE DRAWINGS

The invention will be explained in more detail in conjunction with appended drawings, wherein.

DESCRIPTION OF THE PREFERRED EMBODIMENTS

Before describing a method for fabricating a semiconductor device in the preferred embodiment according to the invention, the aforementioned conventional method for fabricating a semiconductor device will be explained in FIGS. 1A to 1D.

Figure 1A:
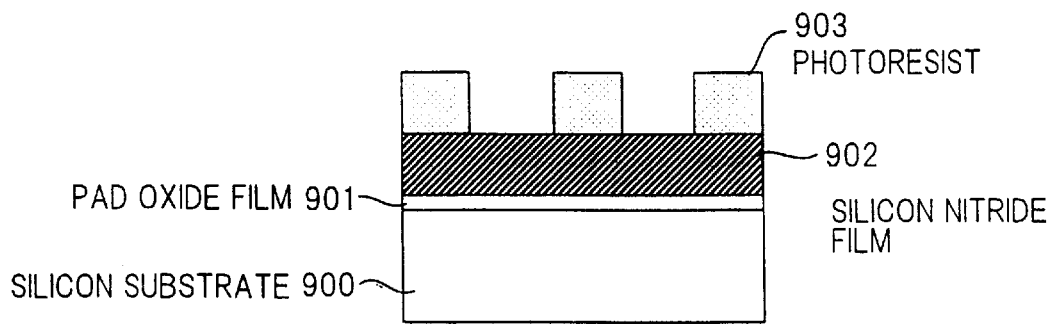
FIGS. 1A to 1D are diagrams showing the steps of isolation by selective oxidation and formation of gate electrodes according to a conventional method for fabricating a semiconductor device.
Figure 1B:
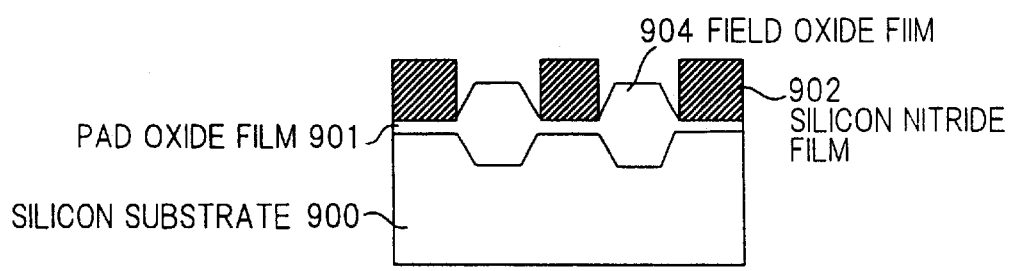
Figure 1C:
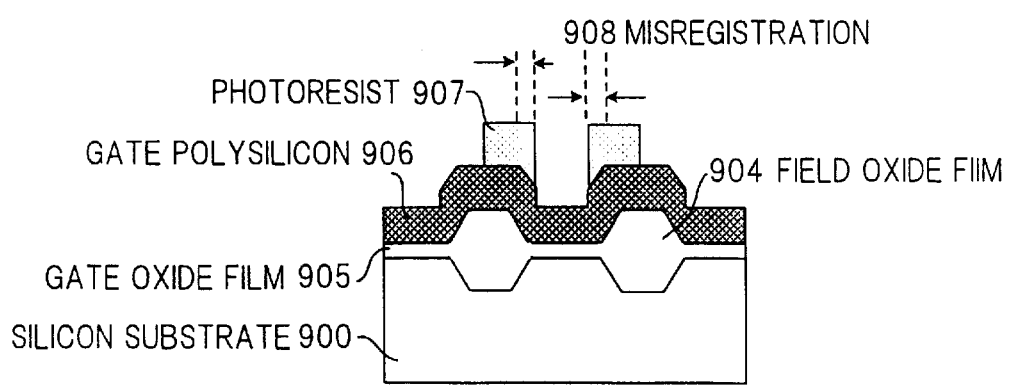
Figure 1D:
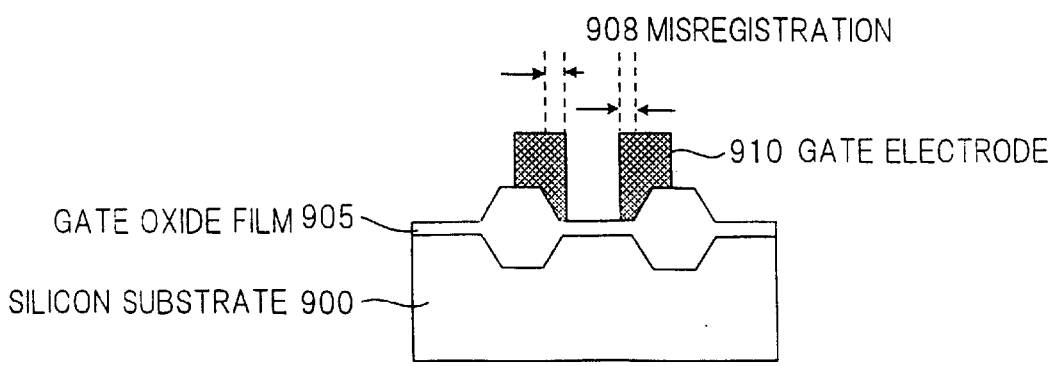

As shown in FIG. 1A, an about 10 nm-thick pad oxide film 901 is formed on a silicon substrate 900, and an about 200 nm-thick silicon nitride film 902 is then formed by CVD. The whole surface of the silicon nitride film is coated with a photoresist 903, and the photoresist 903 is patterned in accordance with a field pattern by photolithography. Next, as shown in FIG. 1B, the silicon nitride film 902 is selectively etched using the photoresist 903 as the mask, and the photoresist 903 is removed, followed by thermal oxidation in a water vapor atmosphere to form a field oxide film 904. As shown in FIG. 1C, the silicon nitride film 903 and the pad oxide film 901 are then removed, a gate oxide film 905 is formed, gate polysilicon 906 is grown on the whole surface of the gate oxide film and the field oxide film, and the gate polysilicon is doped with an impurity by ion implantation or diffusion. A photoresist 907 is coated on the whole surface of the gate polysilicon, and the photoresist 907 is patterned in accordance with a gate pattern by photolithography. In the patterning of the photoresist, registration with the underlying field pattern is carried out. Next, as shown in FIG. 1D, the gate polysilicon 906 is selectively etched using the photoresist 907 as a mask, and the resist is removed to form gate electrodes 910. The gate electrode may be a single polysilicon layer as adopted in this method, or alternatively may have a polycide structure wherein a silicide is stacked on polysilicon. Further, subsequent ion implantation into source/drain may serve also as the doping of the gate polysilicon.

In the conventional method for fabricating a semiconductor device, as shown in FIGS. 1C and 1D, however, misregistration 908 is created in registration for the later step with respect to the underlying field pattern, for example, registration between the gate pattern and the field pattern. This is because the silicon nitride film has strong tensile stress and causes a shrinkage of wafer. Specifically, the resist patterning for the field shown in FIG. 1B is carried out on a silicon substrate shrunken by tensile stress. When the silicon nitride film is removed after the formation of the field oxide film, the silicon substrate is in a stretched state as compared with the time when the resist patterning of the field has been performed. Therefore, the field pattern is larger than the original size. Since the underlying field pattern is larger than the original size, misregistration attributable to a difference in dimension between the field and the gate is created at the time of forming a resist pattern for the gate in a later step. The larger the size of the chip and consequently the smaller the minimum fabrication dimension, the larger the influence of misregistration at the time of registration/exposure attributable to the shrinkage of the wafer created by the stress.

Next, a method for fabricating a semiconductor device in the preferred embodiment according to the invention will be explained.

Figure 2:
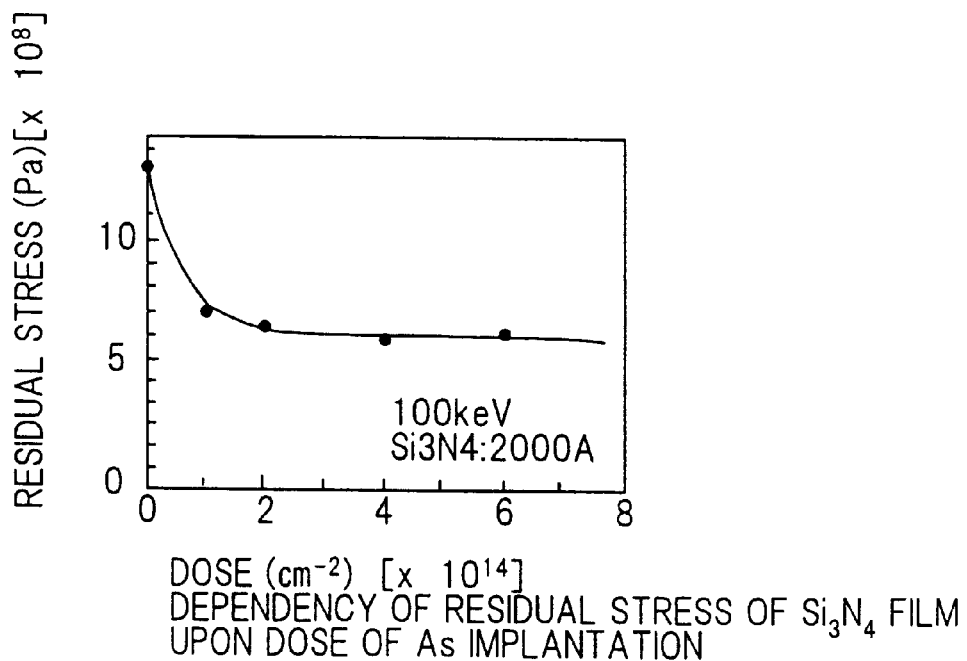
FIG. 2 is a diagram showing the relationship between the residual stress of a 200 nm-thick silicon nitride film and the dose of arsenic implantation.

FIG. 2 is a diagram showing the residual stress of a silicon nitride film as a function of the dose of arsenic implantation in an experiment where arsenic is implanted into a 200 nm-thick silicon nitride film at a dose of 0 to $6 \times 10^{14}$ cm$^{-2}$ with an energy of 100 keV. The residual stress $\sigma t$ of the silicon nitride film was determined from the radius of curvature R in a curve of a wafer formed by growth of a nitride film by the following equation:

$$\sigma t = \frac{E_s h^2}{6(1-v_6)t}\left(\frac{1}{R_2} - \frac{1}{R_1}\right)$$

where Es and $\sigma$ respectively represent Young's modulus and Poisson's ratio of a silicon substrate, h represents the thickness of a silicon wafer, t represents the thickness of a silicon nitride film, and R1 and R2 respectively represent the radius of curvature of the silicon wafer before the growth of the silicon nitride film and the radius of curvature of the silicon wafer after the growth of the silicon nitride film. From FIG. 2, it is apparent that when arsenic is implanted into a 200 nm-thick silicon nitride film with an energy of 100 keV, the residual stress rapidly decreases with increasing the dose of the implantation and is reduced to about half of the initial residual stress at a dose of about $1 \times 10^{14}$ cm$^{-2}$ and then becomes constant.

Figure 3:
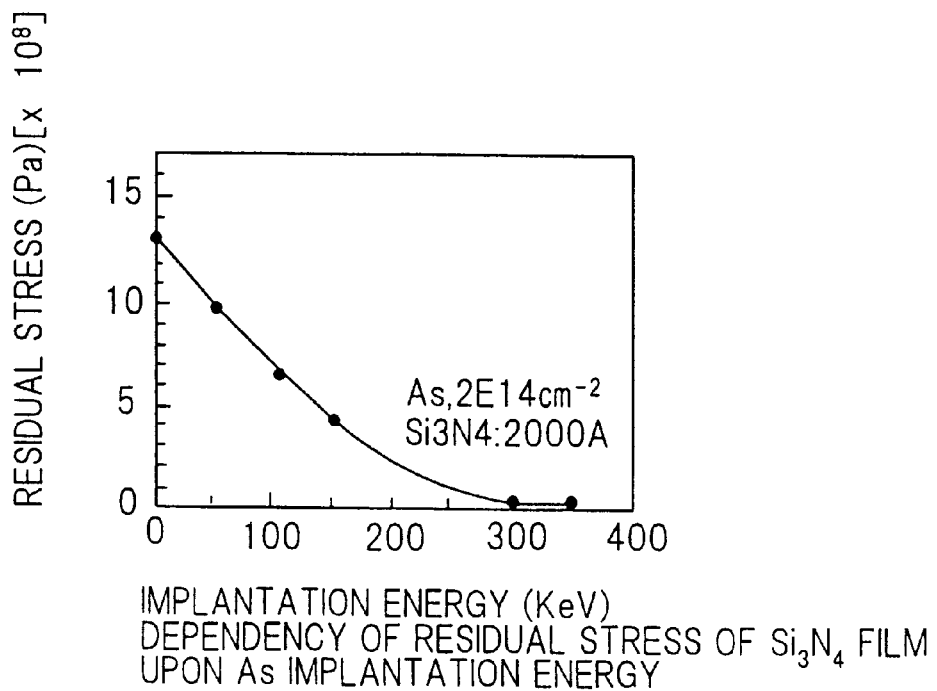
FIG. 3 is a diagram showing the relationship between the residual stress of a 200 nm-thick silicon nitride film and the dose of arsenic implantation energy.

FIG. 3 is a diagram showing the residual stress of a silicon nitride film as a function of the arsenic implantation energy in an experiment where arsenic is implanted into a 200 nm-thick silicon nitride film at a dose of $2 \times 10^{14}$ cm$^{-2}$ in the energy range of from 0 to 350 keV. From FIG. 3, it is apparent that the residual stress of the silicon nitride film monotonously decreases with increasing the implantation energy, becomes substantially zero with an energy of about 250 keV, and, when ions are implanted at an energy exceeding this value, does not change.

Figure 4:
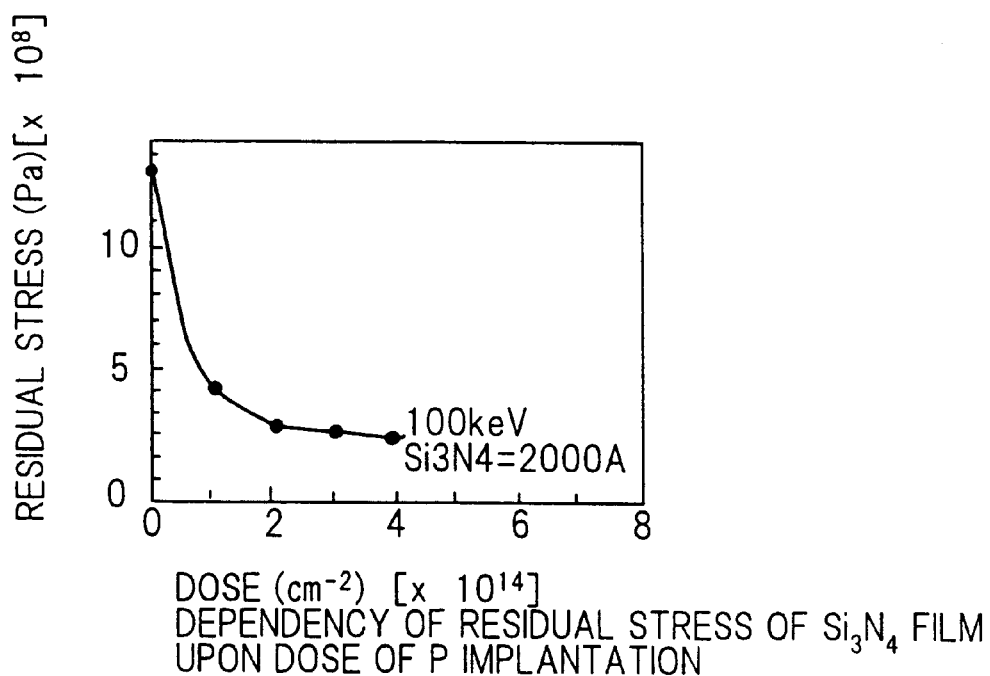
FIG. 4 is a diagram showing the relationship between the residual stress of a 200 nm-thick silicon nitride film and the dose of phosphorus implantation.

FIG. 4 is a diagram showing the residual stress of a silicon nitride film as a function of the dose of phosphorus implantation in an experiment where phosphorus is implanted into a 200 nm-thick silicon nitride film at a dose of 0 to $4\times10^{14}$ cm$^{-2}$ with an energy of 100 keV. From FIG. 4, it is apparent that, as with the arsenic implantation, the residual stress rapidly decreases with increasing the dose of the phosphorus implantation and becomes constant at a dose of not less than about $1\times10^{14}$ cm$^{-2}$. It is also apparent that the constant value is not more than one-third of the value provided in the case where phosphorus is not implanted, indicating that the effect of reducing the stress is larger than that in the case where arsenic is implanted with an energy of 100 keV.

Figure 5:
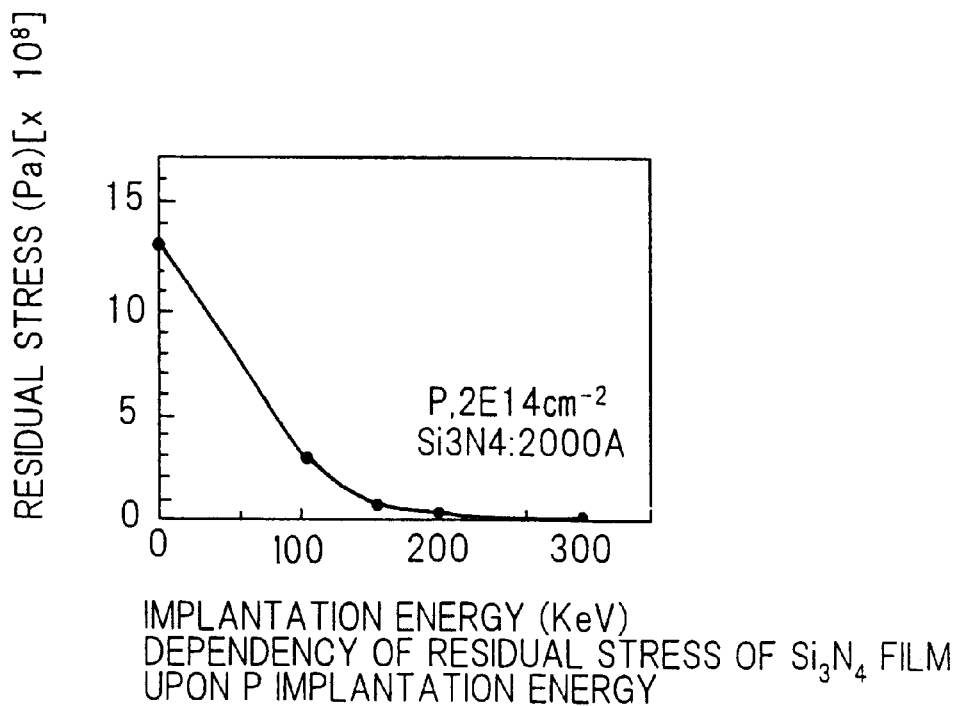
FIG. 5 is a diagram showing the relationship between the residual stress of a 200 nm-thick silicon nitride film and the phosphorus implantation energy.

FIG. 5 is a diagram showing the residual stress of a silicon nitride film as a function of the phosphorus implantation energy in an experiment where phosphorus is implanted into a 200 nm-thick silicon nitride film at a dose of $2\times10^{14}$ cm$^{-2}$ in the energy range of from 0 to 300 keV. From FIG. 5, it is apparent that the residual stress of the silicon nitride film monotonously decreases with increasing the implantation energy, becomes substantially zero with an energy of about 150 keV, and, when the phosphorus ions are implanted with an energy exceeding this value, does not change.

Figure 6:
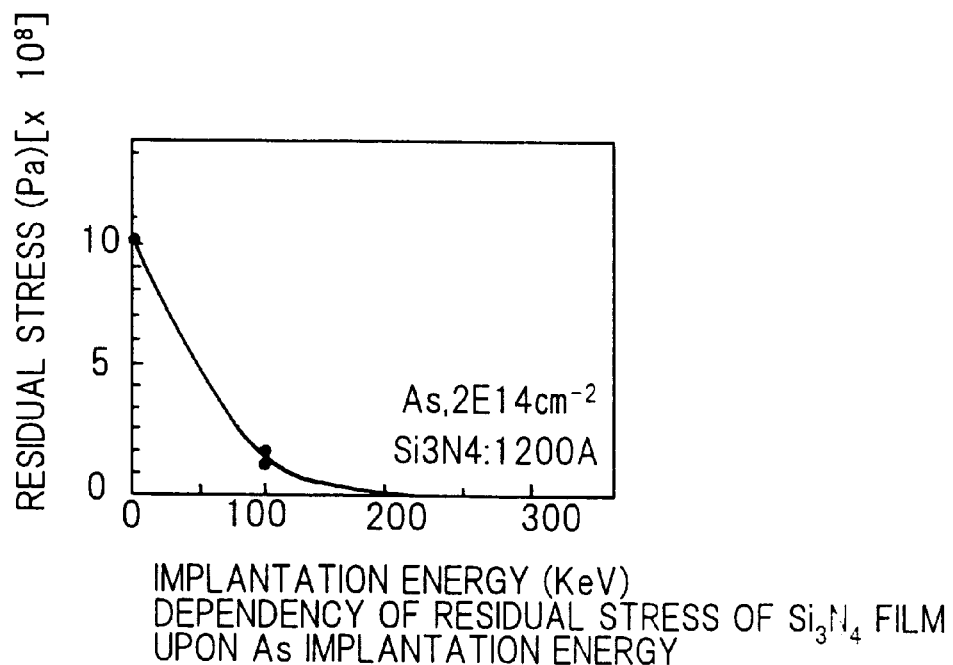
FIG. 6 is a diagram showing the relationship between the residual stress of a 120 nm-thick silicon nitride film and the arsenic implantation energy.

FIG. 6 is a diagram showing the residual stress of a silicon nitride film as a function of the arsenic implantation energy in an experiment where arsenic is implanted into a 120 nm-thick silicon nitride film at a dose of $2\times10^{14}$ cm$^{-2}$ in the energy range of from 0 to 150 keV. From FIG. 6, it is apparent that the residual stress of the silicon nitride film monotonously decreases with increasing the implantation energy, becomes substantially zero with an energy of about 150 keV, and, when the arsenic ions are implanted with an energy exceeding this value, does not change.

The results of experiments in FIGS. 2 to 6 show that implantation of ions into the silicon nitride film has the following effects.

1) The effect of reducing the stress is saturated at an implantation dose of not less than $1\times10^{14}$ cm$^{-2}$.
2) When the implantation energy is identical, the effect of reducing the stress attained by phosphorus is larger than that attained by arsenic.
3) For both arsenic and phosphorus, implantation at satisfactorily high energy brings the residual stress to zero.
4) On identical ion species, implantation dose, and implantation energy bases, the smaller the thickness of the silicon nitride film, the larger the effect of reducing the residual stress.

Figure 7:
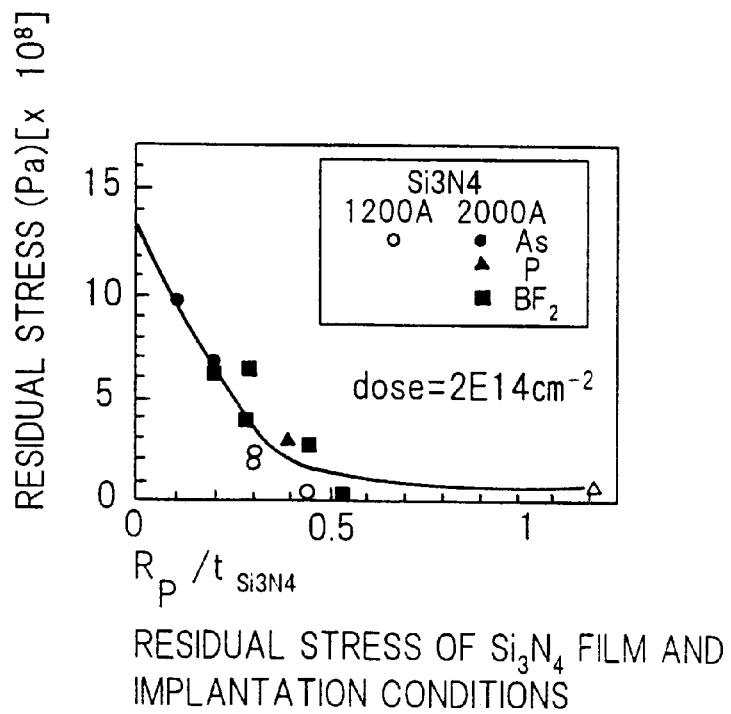
FIG. 7 is a diagram showing the relationship between the residual stress of a silicon nitride film and the projected range of ions standardized by the thickness of the silicon nitride film.

In order to interpret these results, the relationship between the residual stress and the projected range Rp of implanted ions is shown in FIG. 7. The projected range refers to a depth at which the concentration of implanted ions becomes maximum. From this drawing, it is apparent that, independently of the thickness of the silicon nitride film and the kind of implanted ions, when Rp is larger than about half of the thickness of the silicon nitride film, the residual stress of the silicon nitride film becomes substantially zero. The effect of reducing the stress of the silicon nitride film attained by the ion implantation is considered to be based on the following mechanism. The silicon nitride film has tensile stress. Specifically, the silicon nitride film is pulled by the silicon substrate, and the Si—N bond within the film undergoes force in the stretched direction. Implantation of ions into the silicon nitride film to partially cleave the Si—N bond and consequently to increase spacing between the Si atom and the N atom can reduce the force which the Si—N bond remaining uncleaved undergoes. When the projected range is half of the thickness of the silicon nitride film, implanted ions of about $1\times10^{17}$ cm$^{-2}$ reach the interface of the silicon nitride film and the silicon substrate. In general, implantation of ions at this dose into the silicon substrate develops no large crystal defect. In the case of a silicon nitride film with the Si—N bond being strongly stretched, however, the ion implantation at such a dose cleaves the Si—N bond, so that the stress of the whole silicon nitride film can be effectively reduced. When the projected range exceeds 60% of the thickness of the silicon nitride film, a large crystal defect is created in the silicon substrate. For this reason, the projected range is preferably not more than 60% of the thickness of the silicon nitride film.

From the results shown in FIG. 7, it is apparent that, in order to bring the residual stress of the silicon nitride film to substantially zero, even in the case of $1\times10^{15}$ cm$^{-2}$ or less, phosphorus or arsenic may be implanted at a dose of not less than $1\times10^{14}$ cm$^{-1}$ and such an energy that the projected range if located at a position of the half of the thickness of the silicon nitride film or a deeper position (in this case, the projected range may not be deeper beyond the nitride film thickness). In this connection, it should be noted that, even when the projected range is about 20% of the thickness of the silicon nitride film, the residual stress is reduced to about 20 to 30%, that is, the effect of reducing the stress is satisfactorily large. Further, the effect of reducing the stress by the ion implantation is derived from cleaving of the Si—N bond. Therefore, when the projected range is identical, ions having larger mass can provide larger stress reduction effect at a lower dose of implantation. Ions having excessively small mass cannot cleave the Si—N bond, making it difficult to attain satisfactory stress reduction effect. In order to attain satisfactory stress reduction effect, it is preferred to use ions having a mass number equal to or greater than the nitrogen atom constituting the silicon nitride film, that is, ions having a mass number of not less than 14.

On the other hand, when the mass of the ions is excessively large, the implantation energy necessary for increasing the projected range becomes large, imposing limitation on the ion implantation device usable. For this reason, the kind and implantation energy of ions to be used should be selected by taking into consideration the thickness of the silicon nitride film.

Heat treatment of the silicon nitride film, into which ions have been implanted according to the method of the present invention, at a temperature above 950° C. results in recovery of the stress of the silicon nitride film to about 70% of the stress before the ion implantation. Heat treatment at a temperature of 900° C. or below can satisfactorily prevent the recovery of the stress.

The present invention has the following functions. Since the projected range of ions implanted into the silicon nitride film is 20 to 60% of the thickness of the silicon nitride film, the implanted ions hardly penetrate the silicon substrate and hence do not develop defects in the silicon substrate. Further, since satisfactory stress reduction effect can be attained at a low dose of not more than $1\times10^{15}$ cm$^{-2}$, the addition of the step of ion implantation does not lower productivity.

The following examples further illustrate the invention but are not intended to limit it.

EXAMPLE 1

FIGS. 8A to 8D are cross-sectional views showing, in order of steps, a method for fabricating a semiconductor device using isolation by selective oxidation according to the first preferred embodiment of the invention.

Figure 8A:
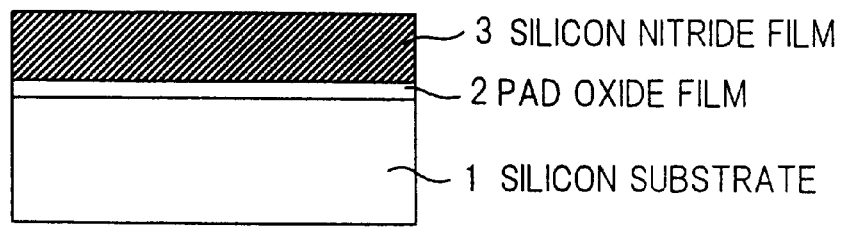
FIGS. 8A to 8D are diagrams showing the step of isolation by selective oxidation according to a first preferred embodiment of the invention.
Figure 8B:
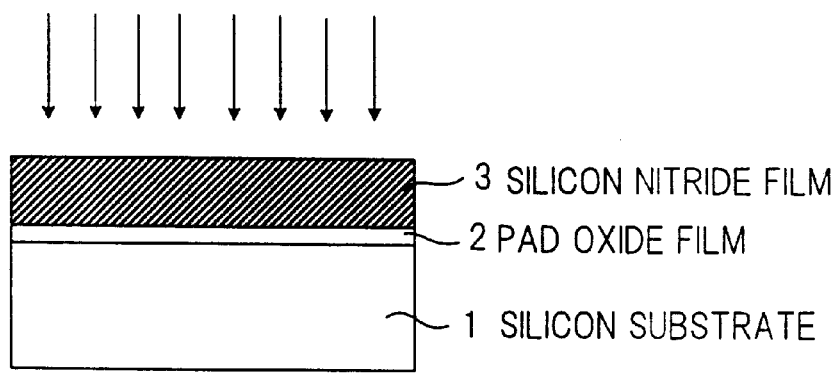
Figure 8C:
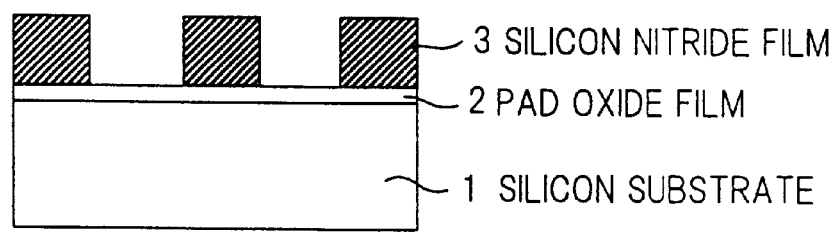
Figure 8D:
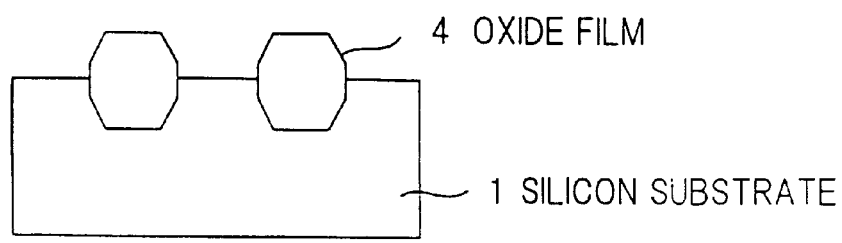

As shown in FIG. 8A, a 10 nm-thick pad oxide film 2 is formed on a silicon substrate 1, and a 200 nm-thick silicon nitride film 3 is grown by LPCVD. Next, as shown in FIG. 8B, phosphorus ions are implanted at a dose of $2\times10^{14}$ cm$^{-2}$ with an energy of 150 keV. Thereafter, as shown in FIG. 8C, the silicon nitride film 3 is selectively removed in accordance with a field pattern by photolithography and dry etching. As shown in FIG. 8D, a 350 nm-thick oxide film 4 is then grown by wet oxidation at 1000° C., and the silicon nitride film 3 and the pad oxide film 2 are removed to complete the isolation by selective oxidation. Thereafter, a gate polycide film (not shown) is formed, and registration between field pattern and gate pattern is carried out by photolithography. In this case, since the stress of the silicon nitride film has been reduced by ion implantation shown in FIG. 8B, misregistration attributable to the shrinkage of the wafer is not created.

In growing the oxide film 4 by wet oxidation at 1000° C., the stress of the silicon nitride film (FIG. 8C) selectively left in device areas is recovered to about 70% of the stress before the ion implantation, leading to shrinkage of the silicon wafer. When the isolation is completed (FIG. 8D), however, the silicon nitride film is completely removed, eliminating the shrinkage. Therefore, there is no influence of the shrinkage on the registration of the gate pattern.

EXAMPLE 2

FIGS. 9A to 9F are cross-sectional views showing, in order of steps, a method for fabricating a semiconductor device using isolation by trench isolation according to the second referred embodiment of the invention.

Figure 9A:
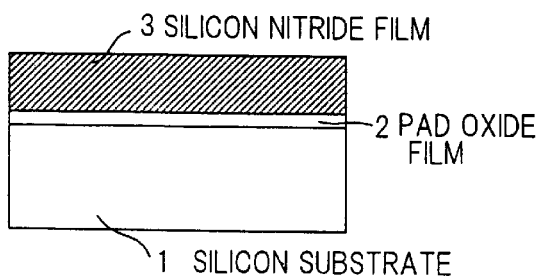
FIGS. 9A to 9F are diagrams showing the step of isolation by trench isolation according to a second preferred embodiment of the invention.
Figure 9E:
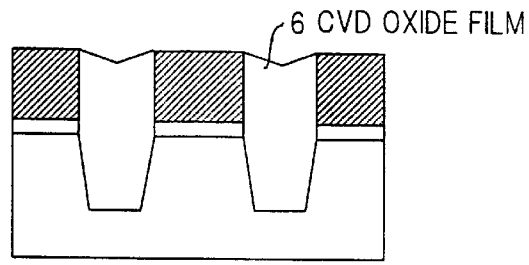
Figure 9B:
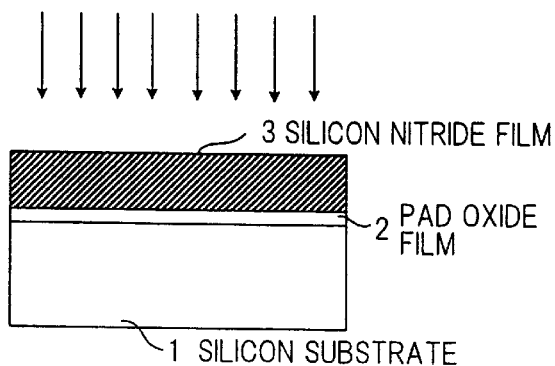
Figure 9F:
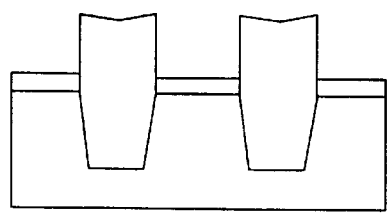
Figure 9C:
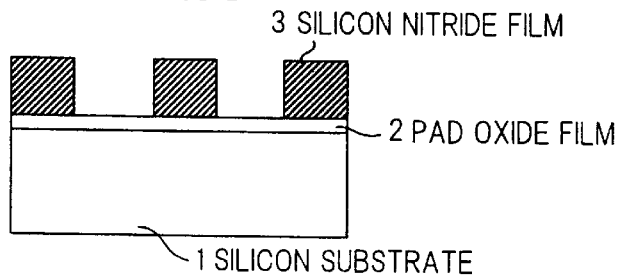
Figure 9D:
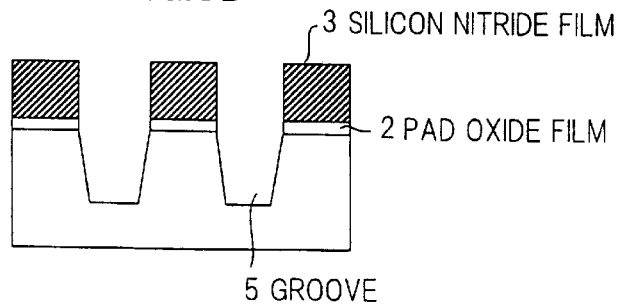

As shown in FIG. 9A, a 10 nm-thick pad oxide film 2 is formed on a silicon substrate 1, and a 120 nm-thick silicon nitride film 3 is grown by LPCVD. Next, as shown in FIG. 9B, arsenic ions are implanted at a dose of $2 \times 10^{14}$ cm$^{-2}$ with an energy of 150 keV. As shown in FIG. 9C, the silicon nitride film 3 is selectively removed in accordance with a field pattern by photolithography and dry etching. Thereafter, as shown in FIG. 9D, grooves 5 are formed in the silicon substrate 1 using the silicon nitride film 3 as a mask. As shown in FIG. 9E, an oxide from is grown on the whole surface by CVD to fill in the grooves 5, and the CVD oxide film on the silicon nitride film 3 is removed by chemical/mechanical polishing to leave the CVD oxide film 6 in the grooves 5 alone. Next, as shown in FIG. 9F, the silicon nitride film 3 and the pad oxide film 2 are removed to complete the isolation by trench isolation. Thereafter, a gate polycide film (not shown) is formed, and a gate polycide film (not shown) is formed, and registration between field pattern and gate pattern is carried out by photolithography. In this case, since the stress of the silicon nitride film has been reduced by ion implantation shown in FIG. 9B, misregistration attributable to the shrinkage of the wafer is not created.

In both Examples 1 and 2, ions are implanted at a dose of not less than $1 \times 10^{14}$ cm$^{-2}$ so that the projected range is located at a position of substantially half of the thickness of the silicon nitride film 3. This brings the residual stress of the silicon nitride film 3 to substantially zero, eliminating the problem of shrinkage of the silicon substrate created by the stress. Therefore, misregistration can be prevented in the registration in a later step, such as the step of forming a gate. In the above examples, phosphorus and arsenic ions were used as ions to be implanted. As is apparent from FIG. 7, however, the effect of relaxing the stress is substantially independently of the kind of ions. Therefore, other ions, such as silicon, argon, nitrogen, and oxygen ions, may also be used as ions to be implanted. Further, from the subject matter of the invention, it is apparent that the thickness of the silicon nitride film is not limited to that described in the above examples.

As is apparent from the foregoing description, the present invention has the following effects. Since the projected range of ions implanted into the silicon nitride film is 20 to 60% of the thickness of the silicon nitride film, the implanted ions hardly penetrate the silicon substrate and hence do not develop defects in the silicon substrate. Further, since satisfactory stress reduction effect can be attained at a low dose of $1 \times 10^{14}$ cm$^{-2}$ to $1 \times 10^{15}$ cm$^{-2}$, the addition of the step of implanting ions dose not results in significantly lowered productivity. Specifically, the stress of the silicon nitride film can be effectively reduced without significantly lowering the productivity and significantly creating defects in the silicon substrate.

FIGS. 10A to 10D show a method for fabricating a semiconductor device in the third preferred embodiment according to the invention, in which a cylindrical type capacitance for a DRAM is formed.

Figure 10A:
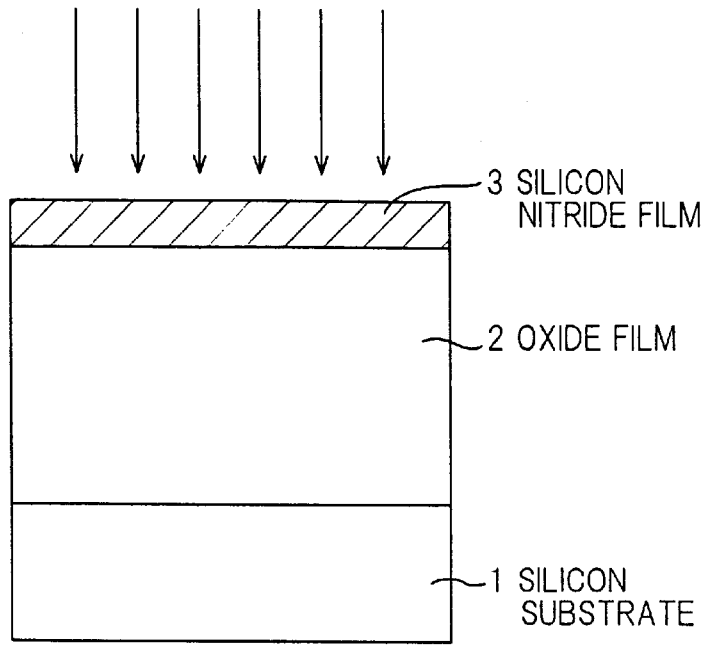
FIGS. 10A to 10D are diagrams showing a method for fabricating a semiconductor device in a third preferred embodiment according to the invention.

In FIG. 10A, an oxide film 2 having a thickness of 5000 Å and a silicon nitride film 3 having a thickness of 1000 Å are successively formed on a silicon substrate 1, and phosphorus ions are implanted into the silicon nitride film 3 at a dose of $2 \times 10^{14}$ cm$^{-2}$ with an energy of 40 keV.

Figure 10B:
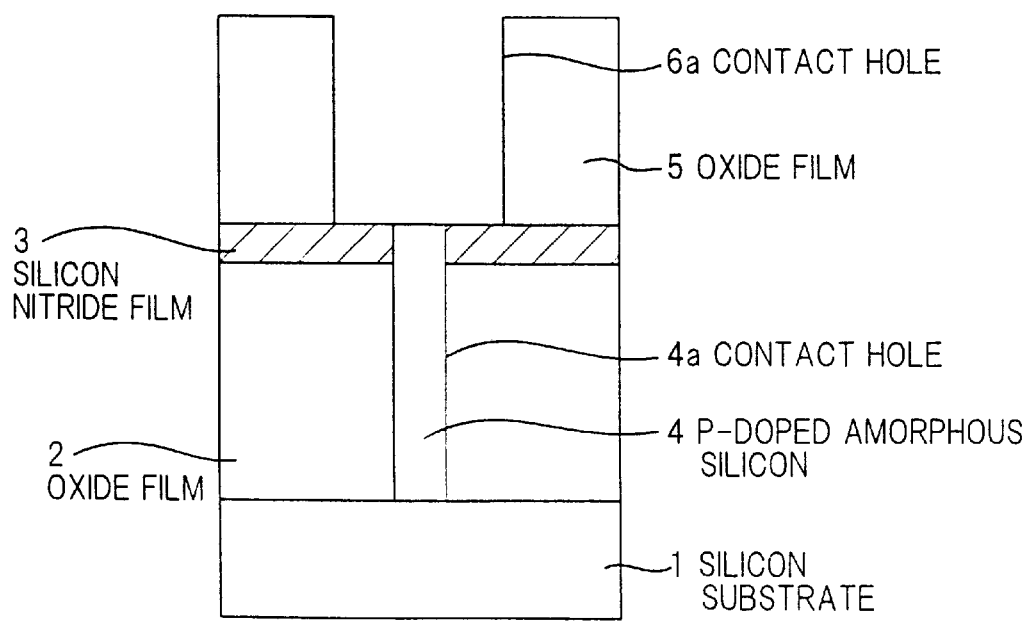

In FIG. 10B, a contact hole 4a reaching the silicon substrate 1 through the oxide and silicon nitride films 2 and 3 is formed and phosphorus-doped amorphous silicon 4 fills the contact hole 4a. Then, an oxide film 5 is grown with a thickness of 6000 Å on the silicon nitride film 3, and a contact hole 6a leading to the contact hole 4a is formed through the oxide film 5.

Figure 10C:
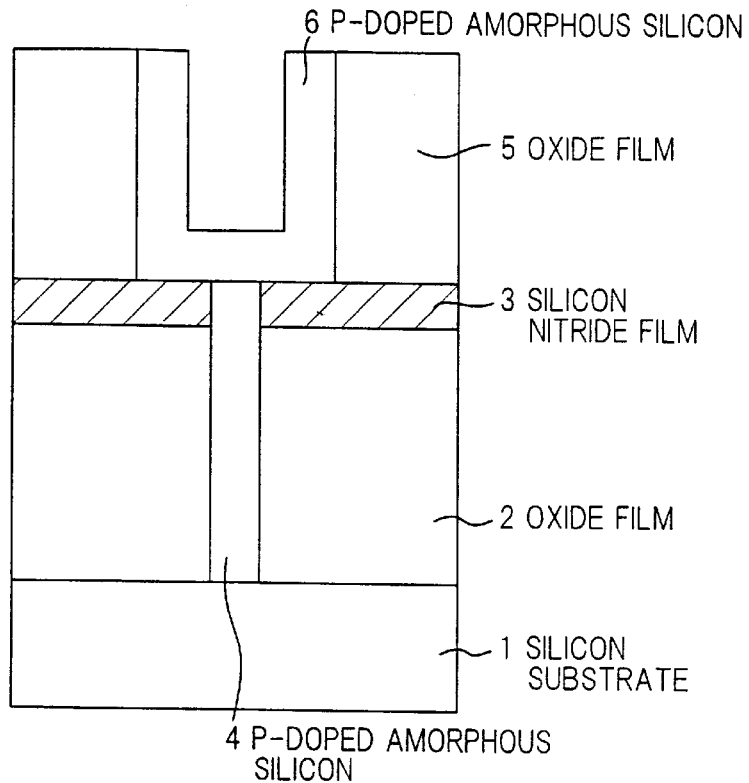

In FIG. 10C, a phosphorus-doped amorphous silicon layer 6 is formed only on the inner surface of the contact hole 6a by growing a thin film of phosphorus-doped amorphous silicon on the whole inner surface of the contact hole 6a, and etching the thin film back.

Figure 10D:
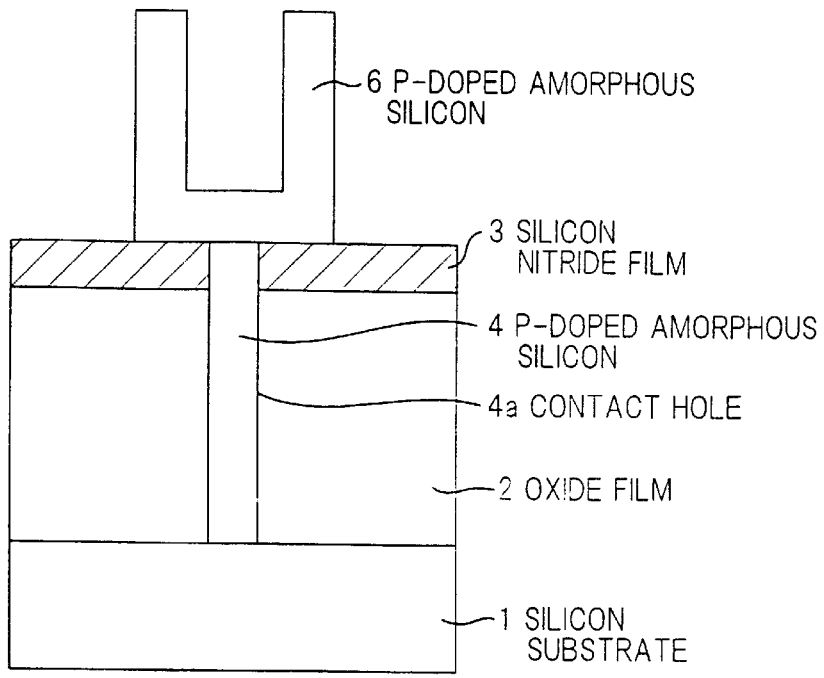

In FIG. 10D, the oxide film 5 is removed by use of diluted hydrofluoric acid.

Thus, a lower electrode for a cylindrical type capacitance which is formed of the amorphous silicon layer 6 is formed. Then, a capacitance insulation film such as nitride film or tantalum oxide is formed, and an upper electrode is formed, so that a DRAM is fabricated.

In FIG. 10A, if phosphorus ions are not implanted into the silicon nitride film 3, stress is concentrated to the contact hole 4a in accordance with the thermal treatment carried out at the time of forming the oxide film 5, the capacitance insulation film, or the upper electrode. As a result, cracks occur in the silicon nitride film 3. This can be avoided in accordance with the implantation of phosphorus ions into the silicon nitride film 3.

The invention has been described in detail with particular reference to preferred embodiments, but it will be understood that variations and modifications can be effected within the scope of the present invention as set forth in the appended claims.

What is claimed is:

1. A method for fabricating a semiconductor device, comprising the steps in sequence of:

forming a pad oxide film and a silicon nitride film successively on a semiconductor substrate;

implanting ions having a mass number of at least 14, by means of a beam directed normal to the substrate, into said silicon nitride film;

selectively removing said silicon nitride film in accordance with a field pattern;

growing silicon oxide films at positions where said silicon nitride film is removed;

removing said pad oxide film and said silicon nitride film which is left at the step of selectively removing said silicon nitride film; and forming a semiconductor device between said silicon oxide films.

2. The method according to claim 1, wherein the projected range of ions implanted into the silicon nitride film is 20 to 60% of the thickness of the silicon nitride film.

3. The method according to claim 1, wherein the dose of the ion implantation is not more than $1\times10^{15}$ cm$^{-2}$.

4. The method according to claim 1, wherein the dose of the ion implantation is $2\times10^{14}$ cm$^{-2}$ to $1\times10^{15}$ cm$^{-2}$.

5. The method according to claim 2, wherein the ions are implanted at a dose of $1\times10^{14}$ cm$^{-2}$ to $1\times10^{15}$ cm$^{-2}$ to a depth of 20 to 60% of the thickness of the silicon nitride film.

6. A method for fabricating a semiconductor device, comprising the steps in sequence of:

forming a pad oxide film and a silicon nitride film successively on a semiconductor substrate;

implanting ions having a mass number of at least 14, by means of a beam directed normal to the substrate, into said silicon nitride film;

selectively removing said silicon nitride film in accordance with a field pattern;

forming grooves into said semiconductor substrate at positions where said silicon nitride film is removed;

filling said grooves and removed portions of said silicon nitride film with silicon oxide films;

removing said silicon nitride film which is left at the step of selectively removing said silicon nitride film; and forming a semiconductor device between said silicon oxide films.

7. The method according to claim 6, wherein the projected range of ions implanted into the silicon nitride film is 20 to 60% of the thickness of the silicon nitride film.

8. The method according to claim 6, wherein the dose of the ion implantation is not more than $1\times10^{15}$ cm$^{-2}$.

9. The method according to claim 6, wherein the dose of the ion implantation is $2\times10^{14}$ cm$^{-2}$ to $1\times10^{15}$ cm$^{-2}$.

10. The method according to claim 7, wherein the ions are implanted at a dose of $1\times10^{14}$ cm$^{-2}$ to $1\times10^{15}$ cm$^{-2}$ to a depth of 20 to 60% of the thickness of the silicon nitride film.

11. A method for fabricating a semiconductor device, comprising the steps of:

forming a silicon nitride film as one of the components formed on a semiconductor substrate; and implanting phosphorus ions at a dose of not more than $1\times10^{15}$ cm$^{-2}$, by means of a beam directed normal to the substrate and to the silicon nitride film, directly into said silicon nitride film to a depth of 20% to 60% from a surface of said silicon nitride film.

12. A method for fabricating a semiconductor device, comprising the steps in sequence of:

forming a pad oxide film and a silicon nitride film successively on a semiconductor substrate;

implanting ions uniformly into and across a surface of said silicon nitride film to a depth less than the thickness of said silicon nitride film;

selectively removing said silicon nitride film in accordance with a field pattern;

growing silicon oxide films at positions where said silicon nitride film is removed;

removing said pad oxide film and said silicon nitride film which is left at the step of selectively removing said silicon nitride film; and forming a semiconductor device between said silicon oxide films.

13. The method according to claim 12, wherein the ions are implanted into the silicon nitride film to a depth of 20 to 60% of the thickness of the silicon nitride film.

14. The method according to claim 12, wherein the dose of the ion implantation is not more than $1\times10^{15}$ cm$^{-2}$.

15. The method according to claim 12, wherein the dose of the ion implantation is $2\times10^{14}$ cm$^{-2}$ to $1\times10^{15}$ cm$^{-2}$.

16. The method according to claim 12, wherein, the ions are implanted at a dose of $1\times10^{14}$ cm$^{-2}$ to $1\times10^{15}$ cm$^{-2}$ to a depth of 20 to 60% of the thickness of the silicon nitride film.

17. A method for fabricating a semiconductor device comprising the steps in sequence of:

forming a pad oxide film and a silicon nitride film successively on a semiconductor substrate;

implanting ions uniformly into said silicon nitride film to a depth less than the thickness of said silicon nitride film;

selectively removing said silicon nitride film in accordance with a field pattern;

forming grooves into said semiconductor substrate at positions where said silicon nitride film is removed;

filling said grooves and removed portions of said silicon nitride film with silicon oxide films;

removing said silicon nitride film which is left at the step of selectively removing said silicon nitride film; and forming a semiconductor device between said silicon oxide films.

18. The method according to claim 17, wherein the ions are implanted into the silicon nitride film to a depth of 20 to 60% of the thickness of the silicon nitride film.

19. The method according to claim 17, wherein the dose of the ion implantation is not more than $1\times10^{15}$ cm$^{-2}$.

20. The method according to claim 17, wherein the dose of the ion implantation is $2\times10^{14}$ cm$^{-2}$ to $1\times10^{15}$ cm$^{-2}$.

21. The method according to claim 17, wherein, the ions are implanted at a dose of $1\times10^{14}$ cm$^{-2}$ to a depth of 20 to 60% of the thickness of the silicon nitride film.

22. A method for fabricating a semiconductor device, comprising the steps in sequence of:

forming a silicon nitride film which is one of component formed on a semiconductor substrate; and implanting phosphorus ions uniformly into and across said silicon nitride film to a depth of 20% to 60%.

* * * * *

UNITED STATES PATENT AND TRADEMARK OFFICE
CERTIFICATE OF CORRECTION

PATENT NO. : 6,146,972
DATED : November 14, 2000
INVENTOR(S) : Ichiro Yamamoto

Page 1 of 1

It is certified that error appears in the above-identified patent and that said Letters Patent is hereby corrected as shown below:

<u>Claim 22, column 10,</u>
Line 54, change "component" to -- components --.

Signed and Sealed this

Fourth Day of December, 2001

Attest:

*Nicholas P. Godici*

NICHOLAS P. GODICI
*Acting Director of the United States Patent and Trademark Office*

*Attesting Officer*